United States Patent
Xue et al.

(10) Patent No.: US 12,368,282 B2
(45) Date of Patent: Jul. 22, 2025

(54) O-BAND SILICON-BASED HIGH-SPEED SEMICONDUCTOR LASER DIODE FOR OPTICAL COMMUNICATION AND ITS MANUFACTURING METHOD

(71) Applicant: FuJian Z.K. Litecore, Ltd., Quanzhou Fujian (CN)

(72) Inventors: Zheng Qun Xue, Quanzhou Fujian (CN); Hui Ying Huang, Quanzhou Fujian (CN); Chang Ping Zhang, Quanzhou Fujian (CN); Ze Lei Lin, Quanzhou Fujian (CN); Rui Yu Fang, Quanzhou Fujian (CN); Hui Su, Quanzhou Fujian (CN)

(73) Assignee: FuJian Z.K. Litecore, Ltd., Quanzhou Fujian (CN)

( * ) Notice: Subject to any disclaimer, the term of this patent is extended or adjusted under 35 U.S.C. 154(b) by 791 days.

(21) Appl. No.: 17/462,604

(22) Filed: Aug. 31, 2021

(65) Prior Publication Data

US 2021/0408767 A1    Dec. 30, 2021

(51) Int. Cl.
| | |
|---|---|
| *H01S 5/34* | (2006.01) |
| *H01S 5/02* | (2006.01) |
| *H01S 5/16* | (2006.01) |
| *H01S 5/22* | (2006.01) |
| *H01S 5/343* | (2006.01) |
| *H04B 10/50* | (2013.01) |

(52) U.S. Cl.
CPC .......... *H01S 5/3427* (2013.01); *H01S 5/021* (2013.01); *H01S 5/168* (2013.01); *H01S 5/2223* (2013.01); *H01S 5/34366* (2013.01); *H04B 10/503* (2013.01)

(58) Field of Classification Search
CPC .... H01S 5/021; H01S 5/2009; H01S 5/34366; H01S 5/168
See application file for complete search history.

(56) References Cited

U.S. PATENT DOCUMENTS

| | | | | |
|---|---|---|---|---|
| 4,965,224 A | * | 10/1990 | Horikawa | .......... H10H 20/0133 |
| | | | | 257/190 |
| 2010/0263707 A1 | * | 10/2010 | Cheong | ................. C30B 25/183 |
| | | | | 257/E21.09 |

FOREIGN PATENT DOCUMENTS

| CN | 106711761 | * | 5/2017 |
|---|---|---|---|
| CN | 108418095 | * | 8/2018 |

* cited by examiner

*Primary Examiner* — Michael Carter
(74) *Attorney, Agent, or Firm* — Jose Cherson Weissbrot

(57) ABSTRACT

The present invention proposes an O-band silicon-based high-speed semiconductor laser diode for optical communication and its manufacturing method, by using different buffer layers to form the growth surface of InP material with low dislocation density; N—InAlGaAs is used instead of conventional N—InAlAs electron-blocking layer in the epi-structure to reduce the barrier for electrons to enter the quantum wells from N-type and lower the threshold; a superlattice structure quantum barrier is used instead of a single layer barrier structure to improve the transport of heavy holes in the quantum wells; and the material structure is adjusted to achieve a reliable O-band high direct modulation speed semiconductor laser diode for optical communication on silicon substrate.

7 Claims, 2 Drawing Sheets

O-BAND SILICON-BASED HIGH-SPEED SEMICONDUCTOR LASER DIODE FOR OPTICAL COMMUNICATION AND ITS MANUFACTURING METHOD

BACKGROUND OF THE INVENTION

Technical Field

The present invention relates to the field of laser diode technology, and in particular to an O-band silicon-based high-speed semiconductor laser diode for optical communication and its manufacturing method.

Background Technology

High-speed InP laser diode are the key light source for high-capacity data centers, 5G wireless and high-capacity PON application. Compared with conventional InP substrates for DML, silicon substrates have the advantages of good electrical and thermal conductivity, low cost, good hardness, and compatibility with InP processing, etc. Fabrication of InP laser diode on silicon is the key to development of InP/SiC PIC; usually, lattice mismatches make it hard to grow InP/InGaAsP/InGaAlAs material directly on silicon. Here, materials with similar lattice constant on silicon are used as buffer layer, the MOCVD growth interface are improved via baking and cleaning thus reduce its dislocation.

Generally, the hole band can be transformed into light hole via using compressive strain quantum wells, which dramatically reduced Auger recombination and IVBA.

The CS quantum well can effectively reduce the effective mass and density states of the hole, which can improve the differential gain and relaxation oscillation frequency of the laser.

In 1990, researchers found that the use of tensile strain quantum wells could further reduce the laser threshold compared to compressive strain, resulting in higher output power and relaxation frequency (Tanban-EK T et al. Performance enhancement of InGaAs/InP quantum well lasers by both tensile and compressive strain. 21 st Internal. Semicon. Laser Conf. 1990; D-3).

In order to further reduce the threshold current and operating current of the laser, tensile strain quantum wells was adopted, more layers of quantum wells are usually used in order to increase the photon and electron density of high speed DML and increase the modulation frequency; the P-type electron blocking layers on the conduction band are usually used to confine electron due to its small effective mass, however, the large effective mass of holes tends to un-uniform distribution in multilayer quantum wells. there are usually two main types of carrier transport in the energy band: one is the crossing of the barrier by a thermal carrier, and the other is the tunneling effect of the carriers, normally quantum barriers cannot achieve a large percentage of tunneling for heavy holes. In addition, due to the concentration of photons and electrons at the laser cavity, semiconductor lasers tend to heat up and form COMD failures, which is one of the more common factors of failure in laser applications.

BRIEF SUMMARY OF THE INVENTION

In order to overcome the shortcomings of the prior art, the present invention provides an O-band silicon-based high-speed semiconductor laser diode for optical communication and its manufacturing method. Graded materials with similar lattice parameters are used on the silicon substrate, and the interface after growth is baked and cleaned to improve the growth interface of the InP material system to reduce dislocations. In addition, thin layers of multilayer superlattices are used as quantum barriers to facilitate hole tunneling between different wells, thus improving the uniformity and differential gain of hole injection. The method of growing PNP current-blocking layers in selected areas near the end faces of light output and backlight can block the current flow to the end faces; on the other hand the combined waveguide of PNP can adjust the spot near-field by adjusting the thickness, reducing the end face photon density of the laser and improving chip reliability. Under the P-side electrode metal, an Fe-doped InP cap layer is used to effectively improve the capacitance parameters of the chip and increase the bandwidth, which can be done without the use of conventional processes such as BCB.

It uses different buffer layers to form the growth surface of InP material with low dislocation density; N—InAlGaAs is used in the epi-structure instead of conventional N—InAlAs electron-blocking layer to reduce the barrier for electrons to enter the quantum wells from N-type and lower the threshold; superlattice structure quantum barriers are used instead of a single layer barrier structure to improve the transport of heavy holes in the quantum wells; and the material structure is adjusted to achieve a reliable O-band high direct modulation speed semiconductor laser diode for optical communication on silicon substrate.

The following technical solutions are specifically used in the present invention:

An O-band silicon-based high-speed semiconductor laser diode for optical communication, characterized in that, on the Si substrate, different buffer layers are used to form a low dislocation density growth surface; in the material structure, N—InAlGaAs is used instead of N—InAlAs electron blocking layer, and a superlattice structure quantum barrier structure is used. Further, said buffer layer includes: N—GaP buffer layer, N—GaAs buffer layer and N—InP buffer layer. And, an O-band silicon-based high-speed semiconductor laser diode for optical communication, characterized in that, its epitaxial layers include layers formed sequentially on the Si substrate: N—GaP buffer layer, N—GaAs buffer layer, N—InP buffer layer, N—InAlGaAs graded layer, InAlGaAs lower waveguide layer, InAlGaAs lower SCH layer, InGaAlAs strain multiple quantum wells and barriers, InAlGaAs upper SCH layer, P—InAlAs electron blocking layer, P—InP spacer layer, P—InGaAsP grating layer, P—InP grating cover layer, P—InGaAsP etching stop layer, P—InP space layer, P—InGaAsP graded layer, P—InGaAs contact layer, and Fe-doped InP cap layer.

Further, the front and rear facets of active region the laser are dissociated in the regrowth region, and the regrowth region is filled with the P—InP layer, N—InGaAsP layer and P—InP layer formed by regrowth.

Further, it also includes the ridge waveguide formed by chemical etching on the epi-wafer.

Further, said ridge waveguide is etched to the P—InGaAsP etching stop layer.

Further, in said InGaAlAs strain multiple quantum wells and barriers, the barrier layer includes three layers of 2 nm InGaAlAs barrier and two layers of 2 nm InGaAlAs well superlattice structure.

And, a manufacturing method of O-band silicon-based high-speed semiconductor laser diode for optical communication, characterized in that, the growth of the epitaxial structure includes the following steps:

Step S1: buffer layer growth: baking the N—Si substrate at high temperature with nitrogen atmosphere for 15 min in the MOCVD chamber, followed by growing 300 nm N—GaP buffer layer; baking it at high temperature with $PH_3$ atmosphere for 15 min, and then growing 300 nm N—GaAs buffer layer; followed by baking it at high temperature with $AsH_3$ atmosphere for 15 min, and growing 500 nm N—InP buffer layer;

Step S2: the epi-growth sequence above the buffer are as follow: 15 nm N—AlGaInAs graded layer, 30 nm undoped AlGaInAs lower waveguide layer; 20 nm undoped AlGaInAs lower SCH layer; 7 layers of 8 nm-AlGaInAs tensile strain quantum wells with at least −1.3% strain, 8 layers of 10 nm-AlGaInAs compressive strain quantum barriers with at least +0.4% strain, the barriers consist of 3 layers of 2 nm-AlGaInAs barriers and 2 layers of 2 nm-AlGaInAs well superlattice structure; 15 nm AlGaInAs upper SCH layer, 25 nm P—InAlAs electron blocking layer; 50 nm P—InP space layer, 40 nm P—InGaAsP grating layer and preparing uniform gratings;

Step S3: depositing $SiO_2$ dielectric layer of 200 nm by PECVD, removing the area of 20 μm near the front and rear facets of active region the laser by photolithographic etching, carrying out isotropic etching with dilute bromine: hydrobromic acid solution, etching depth to the N—InP buffer layer; followed by sequential growing 100 nm P—InP, 50 nm N—InGaAsP, 100 nm P—InP;

Step S4: removing the surface $SiO_2$ layer after the PNP blocking layer growth, then the following materials are growth in sequence by MOCVD: 100 nm P—InP grating buried layer, 25 nm P—InGaAsP etching stop layer, 2.0 micron P—InP space layer, 50 nm P—InGaAsP graded layer, 250 nm P—InGaAs contact layer, 300 nm Fe-doped InP layer, completing the growth of the epi-wafer.

Further, it further includes step S5: deposition 150 nm $SiO_2$ layer, forming laser ridge waveguide after photolithographic and etching, removing surface dielectric layer, deposition 4000 nm $SiO_2$ passivation layer, opening the ohmic contact window of the ridge waveguide, removing insulating InP layer on the top of the ridge waveguide by chemical etch, a Ti/Pt/Au P-type ohmic contact metal are deposited by e-beam, forming electrical isolation on the surface of P-type metal and semiconductor material through the $SiO_2$ passivation layer and Fe-doped InP cap layer, forming a lower chip capacitance; followed by lapping the backside to 200 μm, evaporating N-type metal; cleaving the wafer the laser bar, the $Al_2O_3$/Si film system are evaporated to form the AR/HR of laser cavity, completing the laser diode preparation.

In the present invention and its preferred embodiment, a long GaP buffer layer is first grown by MOCVD on a silicon substrate, followed by GaAs and InP buffer layers in turn, achieving a low-defect material surface for the subsequent epitaxial growth of the laser structure.

In the epitaxial structure, N—AlGaInAs is used instead of conventional N—InAlAs to reduce the height of the barrier, which is conducive to improving the transport of electrons and lowering the threshold; then the tensile strain multiple quantum wells are used to improve the chip operating threshold and bandwidth, and the quantum barriers are thin-layer superlattice structure, which is conducive to the transport of heavy holes between different quantum wells and improves their distribution uniformity.

Instead of using the conventional direct dissociation process on the output and backlight end faces of the laser, a PNP structural layer is grown in the area near the output and backlight end surfaces using a selected area, the reverse PN junction characteristics of the PNP play a limiting role on the electrons, avoiding the carrier flow to the end surface and the photon interaction heat, resulting in COMD (cavity surface catastrophe failure), while the PNP structure material is used as waveguide to adjust the near-field distribution of light spot and reduce the photon density and heat generation of the end face. InP/InGaAsP/InP plays the role of a combined waveguide for the optical field and couples the light in the active region to adjust the laser near-field distribution, improving the near-field spot, reducing the photon density of the end face, and improving the electron and photon interaction of the end face, reducing the divergence angle and improving the catastrophe failure of the end face of the chip.

In addition, the Fe-doped InP cap layer grown on the epitaxial structure can play the role of electrical isolation to reduce the capacitance and increase the bandwidth, thus eliminating the need for conventional processes such as BCB/PI glue to improve the capacitance parameters of the chip and increase the operating bandwidth; the present invention can realize an O-band high-speed semiconductor laser diode for optical communication on silicon substrate.

BRIEF DESCRIPTION OF THE SEVERAL VIEWS OF THE DRAWINGS

The present invention is described in further detail below in combination with the accompanying drawings and specific embodiments.

In the figure: 1 is the N—Si substrate, 2 is the N—GaP buffer layer, 3 is the N—GaAs buffer layer, 4 is the N—InP buffer layer, 5 is the N—InGaAlAs graded layer, 6 is the InGaAlAs lower waveguide layer, 7 is the InGaAlAs lower SCH layer, 8 are the InGaAlAs strain multiple quantum wells and barriers, 9 is the InGaAlAs upper SCH layer, 10 is the P—InAlAs layer, 11 is the P—InP spacer layer, 12 is the P—InGaAsP grating layer, 13 is the P—InP grating cover layer, 14 is the P—InGaAsP etching stop layer, 15 is the P—InP space layer, 16 is the P—InGaAsP graded layer, 17 is the P—InGaAs contact layer, 18 is the Fe-doped InP cap layer, the left and right end surfaces are the dissociation cavity surfaces of the laser in the figure, 19, 20 and 21 are the P—InP, N—InGaAsP and P—InP layers, respectively, for regrowth in the regrowth region, 22 is the regrowth region, 23 is the front facet of active region, 24 is the rear facet of active region, 25 is the ridge waveguide.

Figure 2:
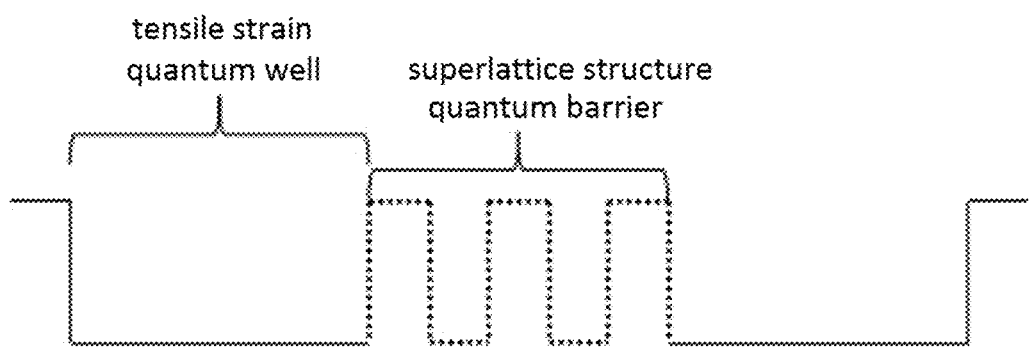

FIG. 2 is a schematic diagram of the quantum well and barrier energy band structure of the guided band of an embodiment of the present invention.

In the figure, the barrier layer consists of superlattice structures with three layers of 2 nm InGaAlAs barriers and two layers of 2 nm InGaAlAs wells, which serve to improve the transport of heavy holes between the quantum wells.

SPECIFIC EMBODIMENTS

Figure 1:
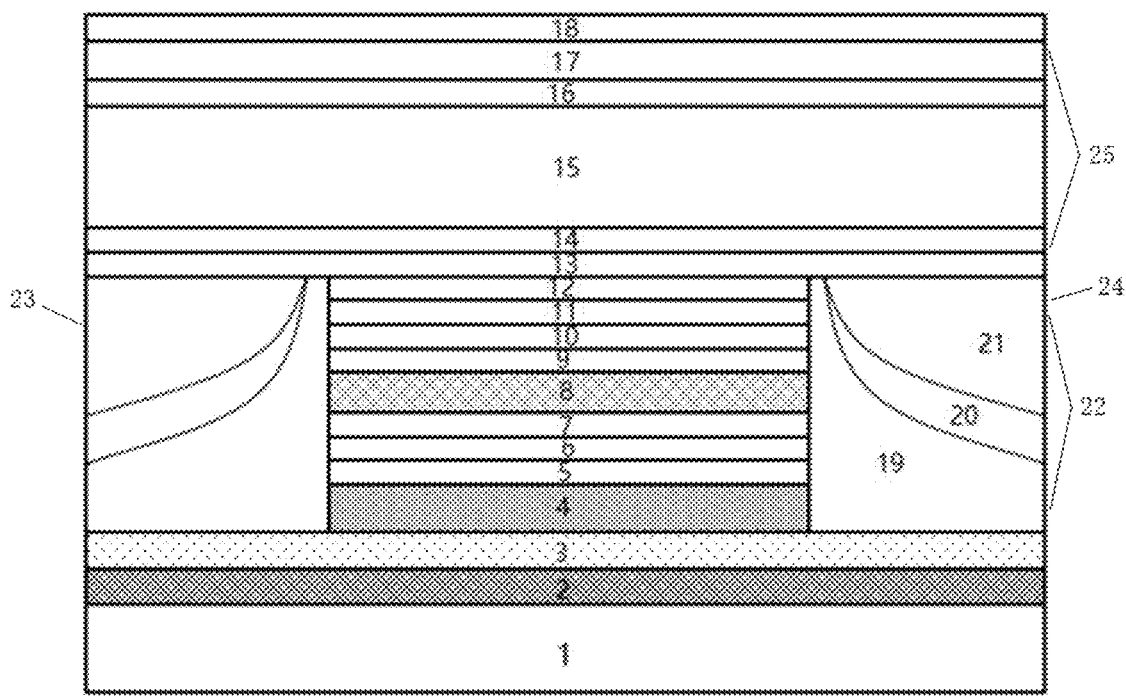
FIG. 1 is a schematic diagram of the epitaxial structure of a high-speed laser diode provided by an embodiment of the present invention.

In order to make the features and advantages of this patent more obvious and understandable, the following embodiments, together with the accompanying drawings, are described in detail as follows:

As shown in FIG. 1, the specific structure of the epitaxial layer of the O-band silicon-based high-speed semiconductor laser diode for optical communication and the manufacturing process of the chip provided in this embodiment are shown as follows:

1. Firstly, baking the 2-inch N—Si substrate 1 at high temperature with nitrogen atmosphere for 15 min in the MOCVD chamber. The role of high temperature baking with carrier gas is mainly twofold, on the one hand, to remove the surface dirty particles, on the other hand, to improve the surface quality of the material growth by using the high temperature mass transport effect to improve the surface flatness, followed by growing 300 nm N—GaP buffer layer 2; baking it at high temperature with $PH_3$ atmosphere for 15 min, and then growing 300 nm N—GaAs buffer layer 3 with a lattice constant similar to GaP; then growing 500 nm N—InP buffer layer 4 at high temperature with $AsH_3$ atmosphere for 15 min, completing the buffer layer growth.

2. Growing 15 nm N—AlGaInAs graded layer 5 and 30 nm undoped AlGaInAs lower waveguide layer 6, low barrier of lower waveguide layer is conducive to improve the transport of electrons; and then growing 20 nm undoped AlGaInAs lower SCH layer 7, 7 layers of 8 nm-AlGaInAs tensile strain quantum wells with at least −1.3% strain and 8 layers of 10 nm-AlGaInAs compressive strain quantum barriers with at least +0.4% strain, the barriers consist of 3 layers of 2 nm-AlGaInAs barriers and 2 layers of 2 nm-AlGaInAs well superlattice structure, as shown in FIG. 2, the quantum barriers are compressive strain and the barriers use a multilayer superlattice structure to improve the transport of holes; compared with the compressive strain quantum wells, the tensile strain has a lower threshold and higher gain and bandwidth characteristics, while the quantum barriers uses a thin-layer superlattice structure, which is more conducive to the transport of heavy holes between quantum wells through the tunneling effect, improving the uniformity of the direct distribution of heavy holes in different quantum wells and thus improving the differential gain and bandwidth saturation characteristics; growing 15 nm AlGaInAs upper SCH layer 9, 25 nm P—InAlAs electron blocking layer 10, 50 nm P—InP layer 11, 40 nm P—InGaAsP grating layer 12, and preparing uniform gratings.

3. Depositing $SiO_2$ dielectric layer 200 nm by PECVD, removing the area of 20 microns near the front facet 23 and the rear facet 24 of active region the laser by photolithographic etching, using dilute bromine: hydrobromic acid solution for isotropic etching, etching depth to N—InP buffer layer; followed by growing 100 nm P—InP 19, 50 nm N—InGaAsP 20, 100 nm P—InP 21, the PNP layer acts as a reverse PN junction when current is passed through it, thus limiting the injection of most of the current into the chip end face and improving the cavity surface catastrophe failure (COMD) caused by the large photon and electron density at the chip end face, in addition, the PNP layer can be used optically as a waveguide layer, and adjusting the thickness of the N—InGaAsP layer can optimize the distribution of the spot near-field at the end face, thus improving the end face photon density and reducing the heat generated at the chip end face.

4. Removing the surface $SiO_2$ layer after the PNP blocking layer growth, then the following materials are growth in sequence by MOCVD: 100 nm P—InP grating cover layer 13, 25 nm P—InGaAsP etching stop layer 14, 2.0 μm P—InP space layer 15, 50 nm P—InGaAsP graded layer 16 250 nm P—InGaAs contact layer 17, 300 nm Fe-doped InP cap layer 18, completing the epitaxial growth of the material.

5. Deposition 150 nm $SiO_2$ layer, photolithographic etching, forming laser ridge waveguide 25 after photolithographic and etching, the rest of the area on the chip remains intact except for the sides of the ridge waveguide being etched; removing the surface dielectric layer, deposition 4000 nm $SiO_2$ passivation layer, opening the ohmic contact window of the ridge waveguide, removing Fe-doped InP cap layer on the ridge waveguide surface, electron beam evaporating Ti/Pt/Au P-type electrode metal, forming electrical isolation on the P-type metal and semiconductor material surface through the $SiO_2$ passivation layer and Fe-doped InP cap layer, forming a lower chip capacitance, without the use of BCB/PI adhesive and other processes, achieving low capacitance and high bandwidth characteristics of the chip; followed by lapping the backside mask to 200 microns, evaporating N-type metal, due to the low body material resistance characteristics of silicon materials, a thicker reduction in thickness has little effect on its series resistance; cleaving the wafer the laser bar, the $Al_2O_3$/Si film system are evaporated to form the AR/HR of laser cavity, completing the chip preparation.

This method uses silicon as the substrate, no heat sink is required in the actual packaging process, and high-speed laser diodes can be used in large quantities in the fields of silicon optical integration, hybrid integration, and silicon optical data centers. This patent is not limited to the best implementation, anyone inspired by this patent can come up with various other forms of O-band silicon-based high-speed semiconductor laser diode for optical communication and its manufacturing method, and all equal variations and modifications made according to the scope of the patent application of this invention shall be covered by this patent.

What is claimed is:

1. An O-band silicon-based high-speed semiconductor laser diode for optical communication, characterized in that, its epitaxial layers include layers formed sequentially on a Si substrate; the layers formed sequentially on the Si substrate comprise an N—GaP buffer layer, an N—GaAs buffer layer, an N—InP buffer layer, an N—InAlGaAs graded layer, an InAlGaAs lower waveguide layer, an InAlGaAs lower SCH layer, InGaAlAs strain multiple quantum wells and barriers, an InAlGaAs upper SCH layer, a P—InAlAs electron blocking layer, a P—InP spacer layer, a P—InGaAsP grating layer, a P—InP grating cover layer, a P—InGaAsP etching stop layer, a P—InP space layer, a P—InGaAsP graded layer, a P—InGaAs contact layer, and an Fe-doped InP cap layer.

2. The O-band silicon-based high-speed semiconductor laser diode for optical communication according to claim 1, characterized in that, a front facet and a rear facet of active region pf the laser diode are dissociated in a regrowth region, and the regrowth region is filled with a P—InP layer, an N—InGaAsP layer and a P—InP layer formed by regrowth.

3. The O-band silicon-based high-speed semiconductor laser diode for optical communication according to claim 2, characterized in that, it also includes a ridge waveguide formed by chemical etching on the epitaxial layer.

4. The O-band silicon-based high-speed semiconductor laser diode for optical communication according to claim 3, characterized in that, said ridge waveguide is etched to the P—InGaAsP etching stop layer.

5. The O-band silicon-based high-speed semiconductor laser diode for optical communication according to claim 1, characterized in that, in said InGaAlAs strain multiple quantum wells and barriers, one superlattice structure barrier includes three layers 2 nm InGaAlAs barrier and two layers 2 nm InGaAlAs well.

6. A manufacturing method of O-band silicon-based high-speed semiconductor laser diode for optical communication, characterized in that, the growth of the epitaxial structure includes the following steps:

Step 1: buffer layer growth; baking the N—Si substrate at high temperature with nitrogen atmosphere for 15 min in the MOCVD chamber, followed by growing 300 nm N—GaP buffer layer; baking it at high temperature with PH atmosphere for 15 min, and then growing 300 nm N—GaAs buffer layer; followed by baking it at high temperature with AsH3 atmosphere for 15 min, and growing 500 nm N—InP buffer layer;

Step S2: the epi-growth sequence above the buffer are as follow: 15 nm N—AlGaInAs graded layer, 30 nm undoped AlGaInAs lower waveguide layer; 20 nm undoped AlGaInAs lower SCH layer; 7 layers of 8 nm-AlGaInAs tensile strain quantum wells with at least −1.3% strain, 8 layers of 10 nm-AlGaInAs compressive strain quantum barriers with at least +0.4% strain, the barriers consist of 3 layers of 2 nm-AlGaInAs barriers and 2 layers of 2 nm-AlGaInAs well superlattice structure; 15 nm AlGaInAs upper SCH layer, 25 nm P—InAlAs electron blocking layer; 50 nm P—InP space layer, 40 nm P—InGaAsP grating layer and preparing uniform gratings;

Step S3: depositing SiO2 dielectric layer of 200 nm by PECVD, removing the area of 20 μm near the front and rear facet of the chip by photolithographic etching, carrying out isotropic etching with dilute bromine: hydrobromic acid solution, etching depth to the N—InP buffer layer; followed by sequential growing 100 nm P—InP, 50 nm N—InGaAsP, 100 nm P—InP;

Step S4: removing the surface SiO2 layer after the PNP blocking layer growth, then the following materials are growth in sequence by MOCVD: 10 nm P—InP grating buried layer, 25 nm P—InGaAsP etch stop layer, 2.0 micron P—InP space layer, 50 nm P—InGaAsP grated layer, 250 nm P—InGaAs contact layer, 300 nm Fe-doped InP layer, completing the growth of the epi-wafer.

7. The manufacturing method of O-band silicon-based high-speed semiconductor laser diode for optical communication according to claim 6, characterized in that, it further includes step S5: deposition 150 nm SiO2 layer, forming laser ridge waveguide after photolithographic and etching, removing surface dielectric layer, deposition 4000 nm SiO2 passivation layer, opening the ohmic contact window of the ridge waveguide, removing insulating InP layer on the top of the ridge waveguide by chemical etch, a Ti/Pt/Au P-type ohmic contact metal are deposited by e-beam, forming electrical isolation on the surface of P-type metal and semiconductor material through the SiO2 passivation layer and Fe-doped InP cap layer, forming a lower chip capacitance; followed by lapping the backside to 200 μm, evaporating N-type cleaving the wafer the laser bar, the Al2O3/Si film system are evaporated to form the AR/HR of laser cavity, completing the laser diode preparation.

* * * * *